US012580393B2

(12) United States Patent
Li et al.

(10) Patent No.: US 12,580,393 B2
(45) Date of Patent: Mar. 17, 2026

(54) CONTROL METHOD OF BATTERY APPARATUS AND BATTERY APPARATUS, SYSTEM, AND MEDIUM

(71) Applicant: CONTEMPORARY AMPEREX TECHNOLOGY (HONG KONG) LIMITED, Hong Kong (CN)

(72) Inventors: Quanguo Li, Ningde (CN); Qian Liu, Ningde (CN); Yonghuang Ye, Ningde (CN); Haizu Jin, Ningde (CN); Fajun Huang, Ningde (CN); Xiaofu Xu, Ningde (CN); Jun Peng, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 409 days.

(21) Appl. No.: 18/324,879

(22) Filed: May 26, 2023

(65) Prior Publication Data

US 2023/0307927 A1     Sep. 28, 2023

Related U.S. Application Data

(63) Continuation of application No. PCT/CN2021/121071, filed on Sep. 27, 2021.

(51) Int. Cl.
*H02J 7/56*          (2026.01)
*G01R 31/36*        (2020.01)
            (Continued)

(52) U.S. Cl.
CPC ............ *H02J 7/56* (2026.01); *G01R 31/3648* (2013.01); *G01R 31/367* (2019.01);
(Continued)

(58) Field of Classification Search
CPC ... H02J 7/0019; G01R 31/367; G01R 31/382; G01R 31/3648; H01M 10/4207; H01M 10/425
(Continued)

(56) References Cited

U.S. PATENT DOCUMENTS

2019/0214833 A1     7/2019  Li et al.
2020/0303930 A1*    9/2020  Edelshtein ............ H02J 7/0019
(Continued)

FOREIGN PATENT DOCUMENTS

CN          106786980 A     5/2017
CN          107069120 A     8/2017
(Continued)

OTHER PUBLICATIONS

The European Patent Office (EPO) The Extended European Search Report for Application No. 21958040.4 May 3, 2024 8 Pages.
(Continued)

*Primary Examiner* — Nathaniel R Pelton
(74) *Attorney, Agent, or Firm* — ANOVA LAW GROUP, PLLC

(57)          ABSTRACT

A control method of a battery apparatus includes acquiring a state parameter of a first battery module of the battery apparatus, controlling the first battery module and a charging device to form a first charging loop in response to the state parameter of the first battery module being less than a preset threshold, and controlling the first battery module, a second battery module of the battery apparatus, and the charging device to be connected in series to form a second charging loop in response to the state parameter of the first battery module being greater than or equal to the preset threshold. A charging rate of the first charging loop is higher than a charging rate of the second charging loop.

13 Claims, 5 Drawing Sheets

(51) Int. Cl.

| | |
|---|---|
| *G01R 31/367* | (2019.01) |
| *G01R 31/382* | (2019.01) |
| *H01M 10/42* | (2006.01) |

(52) U.S. Cl.
CPC ...... *G01R 31/382* (2019.01); *H01M 10/4207* (2013.01); *H01M 10/425* (2013.01); *H01M 2010/4271* (2013.01)

(58) Field of Classification Search
USPC ........................................................ 320/116
See application file for complete search history.

(56) References Cited

U.S. PATENT DOCUMENTS

| | | | | |
|---|---|---|---|---|
| 2021/0218251 A1* | 7/2021 | Chettiar | ................ | H02J 7/0068 |
| 2021/0309115 A1* | 10/2021 | Von Emden | ............ | B60L 50/64 |
| 2021/0399558 A1* | 12/2021 | Ono | ...................... | H02J 7/0024 |
| 2022/0037893 A1* | 2/2022 | Tanaka | ................ | H01M 10/482 |
| 2023/0264596 A1* | 8/2023 | Ko | ......................... | H02J 7/0013 |
| | | | | 320/109 |
| 2023/0268758 A1* | 8/2023 | Ahrens | ................. | H02J 7/0034 |
| | | | | 320/118 |

FOREIGN PATENT DOCUMENTS

| | | | |
|---|---|---|---|
| CN | 108891288 | A | 11/2018 |
| CN | 112599891 | A | 4/2021 |
| WO | 2020191550 | A1 | 10/2020 |
| WO | 2020206700 | A1 | 10/2020 |
| WO | 2021142286 | A1 | 7/2021 |

OTHER PUBLICATIONS

The World Intellectual Property Organization (WIPO) International Search Report for PCT/CN2021/121071 Feb. 18, 2022 4 pages (including English translation).

* cited by examiner

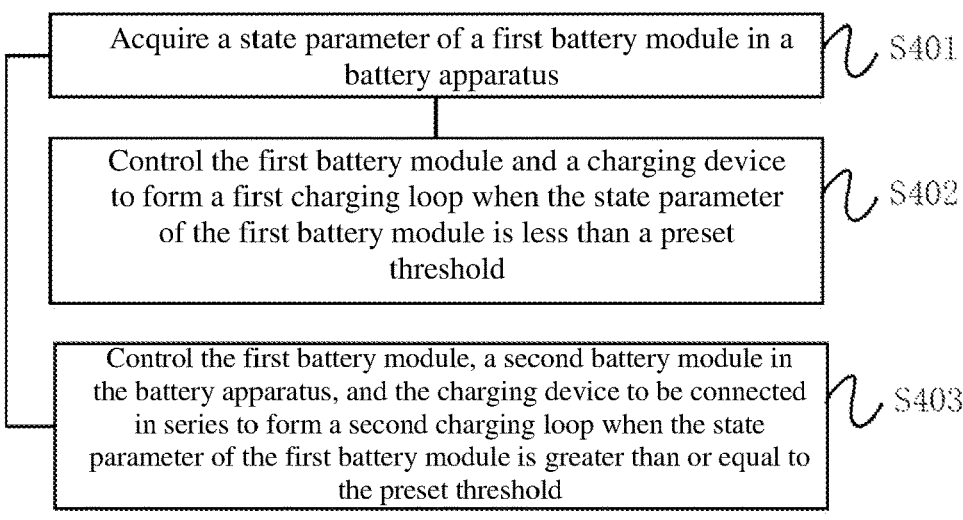

Acquire a state parameter of a first battery module in a battery apparatus ⟿ S401

Control the first battery module and a charging device to form a first charging loop when the state parameter of the first battery module is less than a preset threshold ⟿ S402

Control the first battery module, a second battery module in the battery apparatus, and the charging device to be connected in series to form a second charging loop when the state parameter of the first battery module is greater than or equal to the preset threshold ⟿ S403

FIG. 4

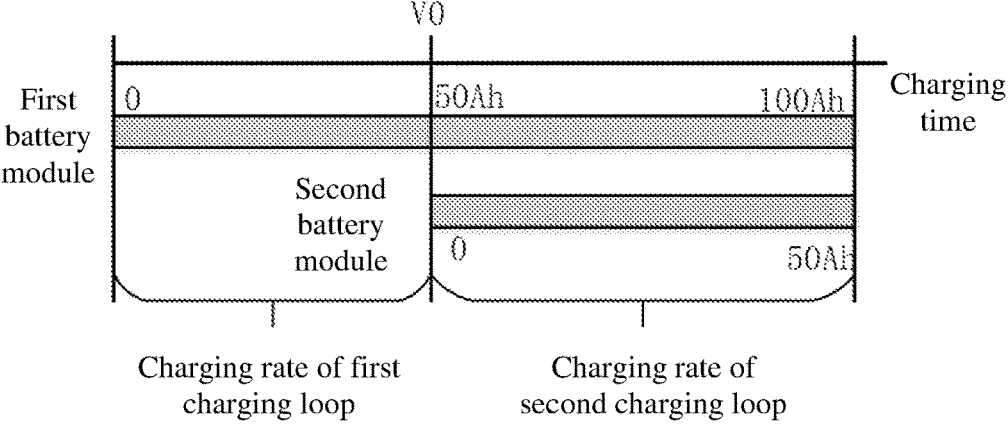

VO

First battery module    0    50Ah    100Ah    Charging time

Second battery module    0    50Ah

Charging rate of first charging loop

Charging rate of second charging loop

FIG. 5

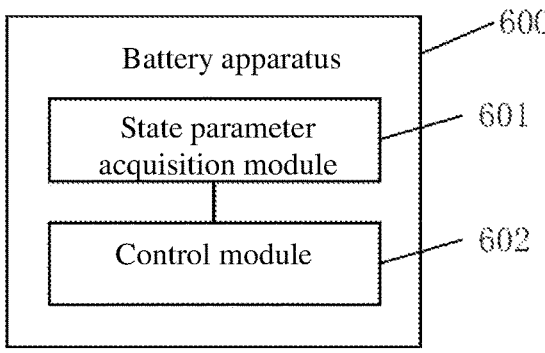

Battery apparatus — 600

State parameter acquisition module — 601

Control module — 602

FIG. 6

CONTROL METHOD OF BATTERY APPARATUS AND BATTERY APPARATUS, SYSTEM, AND MEDIUM

CROSS-REFERENCE TO RELATED APPLICATION

This application is a continuation of International Application No. PCT/CN2021/121071, filed on Sep. 27, 2021, the entire content of which is incorporated herein by reference.

TECHNICAL FIELD

The present application belongs to the technical field of batteries, and in particular, to a control method of a battery apparatus and a battery apparatus, a system, and a medium.

BACKGROUND ART

With the development of new energy technologies, application fields of batteries are more and more extensive. For example, batteries may be used as a power source to provide power for electrical devices, thereby reducing the use of non-renewable resources.

However, with the development of batteries, batteries often face the range problem. At present, two battery modules made of different materials are usually arranged in a battery to improve the range of the battery. However, due to the difference of materials, maximum charging rates that the two battery modules can bear are different. To ensure the charging safety, a smaller value of the maximum charging rates that the two battery modules can bear is usually used for charging the two battery modules at the same time, resulting in a slow charging speed of the battery. As can be seen, the charging speed is slow when the battery is provided with two battery modules.

SUMMARY

Embodiments of the present application provides a control method of a battery apparatus and a battery apparatus, a system, and a medium, which is capable of at least solving the current problem of a slow charging speed when a battery is provided with two battery modules.

In the first aspect, the embodiments of the present application provide a control method of a battery apparatus, comprising:

acquiring a state parameter of a first battery module in the battery apparatus;

controlling the first battery module and a charging device to form a first charging loop when the state parameter of the first battery module is less than a preset threshold; and controlling the first battery module, a second battery module in the battery apparatus and the charging device to be connected in series to form a second charging loop when the state parameter of the first battery module is greater than or equal to the preset threshold;

wherein a charging rate of the first charging loop is higher than a charging rate of the second charging loop.

In this embodiment, because the charging rate of the first charging loop is higher than the charging rate of the second charging loop, in a charging process of the battery, the battery module forming a charging loop with the charging device is charged by using a different charging rate according to a comparison result of the state parameter of the first battery module and the preset threshold. That is, when the state parameter of the first battery module is less than the preset threshold, the first charging loop is charged by using the charging rate of the first charging loop; and when the state parameter of the first battery module rises to be greater than or equal to the preset threshold, it is changed to charge the first battery module and the second battery module at the same time by using the charging rate of the second charging loop. In this way, compared with the current charging process in which charging is performed by using a smaller charging rate that two battery modules can bear, the charging speed can be improved on the premise of ensuring the charging safety.

In some embodiments, after the controlling the first battery module and the charging device to form a first charging loop, the method further includes:

acquiring a charged battery capacity of the first battery module;

updating the charging rate of the first charging loop based on the charged battery capacity of the first battery module; and controlling the charging device to charge the first battery module according to the charging rate of the first charging loop.

In this embodiment, in the process of the charging device charging the first battery module through the first charging loop, the first battery module may be charged by using the charging rate determined based on the charged battery capacity of the first battery module, so that the charging rate may be adjusted according to a charging capacity.

In some embodiments, a first charging rate determined based on a first charged battery capacity of the first battery module is higher than a second charging rate determined based on a second charged battery capacity of the first battery module, and the first charged battery capacity is lower than the second charged battery capacity.

In this embodiment, the charging rate of the first charging loop may be reduced as the charged battery capacity of the first battery module increases, thereby not only ensuring the charging speed, but also improving the security in the charging process.

In some embodiments, the state parameter includes a state of charge SOC or a voltage.

In this embodiment, the method of acquiring the state parameter of the first battery module may be simple and flexible.

In some embodiments, when a rated capacity of the first battery module is higher than a rated capacity of the second battery module, if an uncharged battery capacity of the first battery module is equal to the rated capacity of the second battery module, then the state parameter of the first battery module is equal to the preset threshold.

In this embodiment, when the uncharged battery capacity of the first battery module is equal to the rated capacity of the second battery module, the first battery module and the second battery module may be charged by switching to a smaller charging rate, which can not only improve the charging speed, but also ensure the charging safety.

In the second aspect, the embodiments of the present application further provide a battery apparatus, including:

a first battery module and a second battery module;

a switch unit, wherein the switch unit is connected to the first battery module and the second battery module, the switch unit is in a first working state or a second working state, and when a charging device charges the battery and the switch unit is in the first working state, the first battery module and the charging device form a first charging loop; and when the charging device charges the battery and the switch unit is in the second working state, the first battery module, the second battery module and the charging device are connected in series to form a second charging loop;

a battery management unit, wherein the battery management unit is connected to the switch unit and the first battery module, and the battery management unit is configured to control the switch unit to be in the first working state when a state parameter of the first battery module is less than a preset threshold; and control the switch unit to be in the second working state when the state parameter of the first battery module is greater than or equal to the preset threshold, wherein a charging rate of the first charging loop is higher than a charging rate of the second charging loop.

In this embodiment, because the charging rate of the first charging loop is higher than the charging rate of the second charging loop, in a charging process of the battery, the battery module forming a charging loop with the charging device is charged by using a different charging rate according to a comparison result of the state parameter of the first battery module and the preset threshold. That is, when the state parameter of the first battery module is less than the preset threshold, the first charging loop is charged by using the charging rate of the first charging loop; and when the state parameter of the first battery module rises to be greater than or equal to the preset threshold, it is changed to charge the first battery module and the second battery module at the same time by using the charging rate of the second charging loop. In this way, compared with the current charging process in which charging is performed by using a smaller charging rate that two battery modules can bear, the charging speed can be improved on the premise of ensuring the charging safety.

In some embodiments, a first end of the first battery module is configured to be connected to a second end of the charging device when the charging device charges the battery apparatus;

the switch unit comprises:

a first switch, wherein a first end of the first switch is connected to the battery management unit, and the first end of the first switch is further configured to be connected to a first end of the charging device when the charging device charges the battery apparatus; a second end of the first switch is connected to a second end of the first battery module; and a third end of the first switch is connected to a first end of the second battery module; and a second switch, wherein a first end of the second switch is connected to the second end of the first switch, and a second end of the second switch is connected to a second end of the second battery module;

wherein when the charging device charges the battery apparatus, if the first end of the first switch is connected to the second end of the first switch, and the first end of the second switch is disconnected from the second end of the second switch, then the first battery module and the charging device form the first charging loop; and if the first end of the first switch is connected to a third end of the first switch, and the first end of the second switch is connected to the second end of the second switch, then the first battery module, the second battery module, and the charging device are connected in series to form the second charging loop.

In this embodiment, by arranging the first switch and the second switch, it may be achieved that formation of the first charging loop and the second charging loop between the battery apparatus and the charging device is controlled respectively. The implementation method is simple and the operation reliability is high.

In some embodiments, the first battery module includes M first battery cells, the second battery module includes N second battery cells, and the M and the N are both integers greater than 1;

when M is less than or equal to N, at least one second battery cell of the N second battery cells is arranged between two adjacent first battery cells of the M first battery cells; and when M is greater than N, at least one first battery cell of the M first battery cells is arranged between two adjacent second battery cells of the N second battery cells.

In this embodiment, by arranging the M first battery cells and the N second battery cells in a spacing manner, not only the heat dissipation performance of the first battery module in the charging process may be improved, but also the temperature of the second battery cell may be increased through the heat of the first battery cell thereby improving the charging performance of the second battery module.

In the third aspect, the embodiments of the present application provide a battery apparatus, including:

a state parameter acquisition module configured to acquire a state parameter of a first battery module in the battery apparatus;

control module configured to control the first battery module and the charging device to form a first charging loop when the state parameter of the first battery module is less than a preset threshold; and control the first battery module, the second battery module in the battery apparatus, and the charging device to be connected in series to form a second charging loop when the state parameter of the first battery module is greater than or equal to the preset threshold;

wherein a charging rate of the first charging loop is higher than a charging rate of the second charging loop.

In this embodiment, because the charging rate of the first charging loop is higher than the charging rate of the second charging loop, in a charging process of the battery, the battery module forming a charging loop with the charging device is charged by using a different charging rate according to a comparison result of the state parameter of the first battery module and the preset threshold. That is, when the state parameter of the first battery module is less than the preset threshold, the first charging loop is charged by using the charging rate of the first charging loop; and when the state parameter of the first battery module rises to be greater than or equal to the preset threshold, it is changed to charge the first battery module and the second battery module at the same time by using the charging rate of the second charging loop. In this way, compared with the current charging process in which charging is performed by using a smaller charging rate that two battery modules can bear, the charging speed can be improved on the premise of ensuring the charging safety.

In some embodiments, the apparatus further includes:

a charged battery capacity acquisition module configured to acquire a charged battery capacity of the first battery module; and a charging rate updating module configured to update the charging rate of the first charging loop based on the charged battery capacity of the first battery module.

In this embodiment, in the process of the charging device charging the first battery module through the first charging loop, the first battery module may be charged by using the charging rate determined based on the charged battery capacity of the first battery module, so that the charging rate may be adjusted according to a charging capacity.

In some embodiments, a first charging rate determined based on a first charged battery capacity of the first battery module is higher than a second charging rate determined based on a second charged battery capacity of the first battery module, and the first charged battery capacity is lower than the second charged battery capacity.

In this embodiment, the charging rate of the first charging loop may be reduced as the charged battery capacity of the first battery module increases, thereby not only ensuring the charging speed, but also improving the security in the charging process.

In some embodiments, the state parameter includes a state of charge SOC or a voltage.

In this embodiment, the method of acquiring the state parameter of the first battery module may be simple and flexible.

In some embodiments, when a rated capacity of the first battery module is higher than a rated capacity of the second battery module, if an uncharged battery capacity of the first battery module is equal to the rated capacity of the second battery module, then the state parameter of the first battery module is equal to the preset threshold.

In this embodiment, when the uncharged battery capacity of the first battery module is equal to the rated capacity of the second battery module, the first battery module and the second battery module may be charged by switching to a smaller charging rate, which can not only improve the charging speed, but also ensure the charging safety.

In the fourth aspect, a charging system is provided, including a charging device and the battery apparatus provided by any optional embodiment of the second aspect.

In the fifth aspect, a battery apparatus is provided, including:

a processor and a memory storing computer program instructions;

wherein the processor reads and executes the computer program instructions to implement the control method of a battery apparatus provided by any optional embodiment of the first aspect.

In the sixth aspect, a computer storage medium is provided, computer program instructions are stored on the computer storage medium, and when executed by a processor, the computer program instructions implement the control method of a battery apparatus provided by any optional embodiment of the first aspect.

DESCRIPTION OF DRAWINGS

In order to illustrate the technical solutions of the examples of the present application more clearly, the following briefly introduces the drawings required in the examples of the present application. Obviously, the drawings described below are only some examples of the present application. For those of ordinary skill in the art, other drawings can also be obtained according to the drawings without any creative effort.

FIG. 4 is a schematic flow chart of a control method of a battery apparatus according to an embodiment of the present application;

FIG. 5 is a schematic diagram of a charging process of a battery apparatus according to an embodiment of the present application;

FIG. 6 is a schematic structural view of a battery apparatus according to an embodiment of the present application;

DETAILED DESCRIPTION

The embodiments of the present application are further described in detail below with reference to the drawings and embodiments. The following detailed description of the embodiments and the drawings are used to illustrate the principles of the present application by way of example, but should not be used to limit the scope of the present application, that is, the present application is not limited to the described embodiments.

It should be noted that relational terms such as first and second herein are used only to distinguish one entity or operation from another and do not necessarily require or imply any such actual relationship or order between these entities or operations. Furthermore, the term "include," "comprise," or any other variation thereof is intended to cover a non-exclusive inclusion such that a process, method, article, or device include a series of elements includes not only those elements, but further includes other elements not expressly listed, or further includes elements inherent in such a process, method, article, or device. Without further limitations, an element defined by a statement "including . . . " does not exclude the presence of an additional identical element in the process, method, article, or device that includes the element.

In order to better understand the present application, the battery and its control method, apparatus, device, and medium according to the embodiments of the present application will be described in detail below with reference to the accompanying drawings. It should be noted that the embodiments are not intended to limit the scope of the disclosure of the present application.

Figure 1:
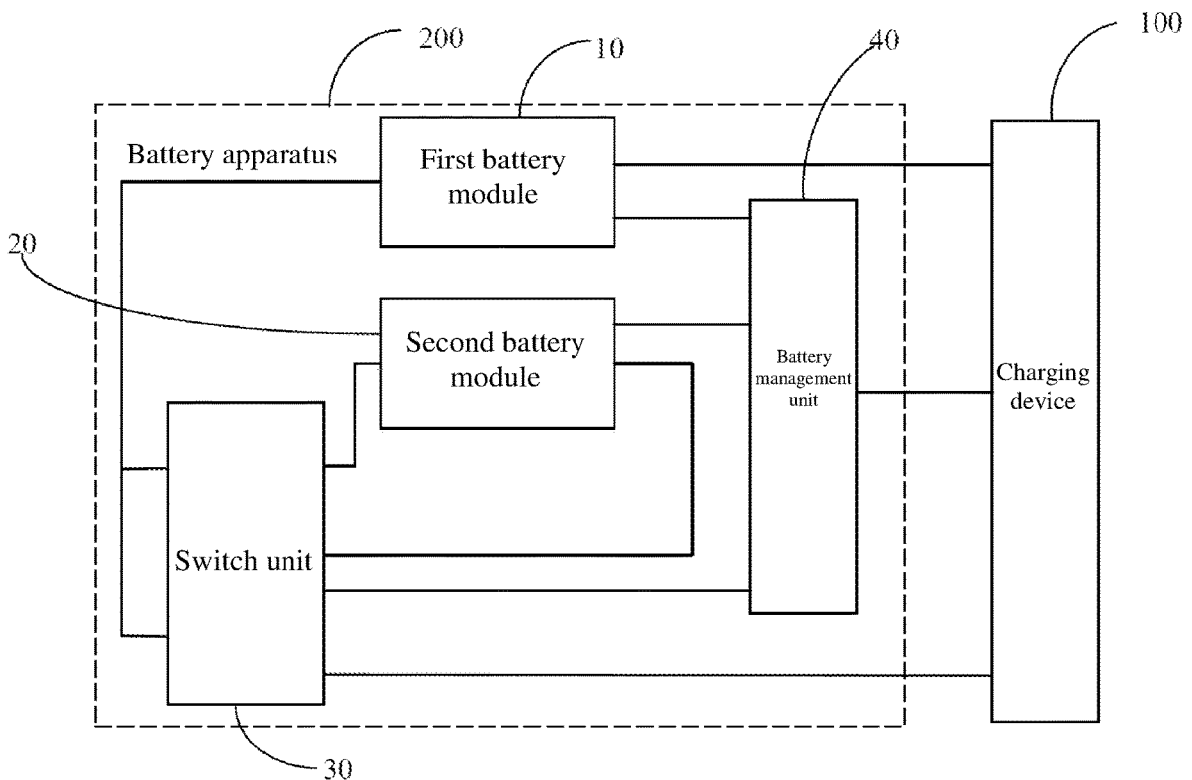
FIG. 1 is a first schematic structural diagram of a charging system according to an embodiment of the present application.

According to some embodiments of the present application, FIG. 1 is a schematic structural diagram of a charging system according to an embodiment of the present application. As shown in FIG. 1, the charging system includes a charging device 100 and a battery apparatus 200. The battery apparatus 200 may include:

a first battery module 10 and a second battery module 20;

a switch unit 30, wherein the switch unit 30 is connected to the first battery module and the second battery module 20, the switch unit 30 is in a first working state or a second working state, and when the charging device 100 charges the battery and the switch unit 30 is in the first working state, the first battery module 10 and the charging device 100 form a first charging loop; when the charging device 100 charges the battery and the switch unit 30 is in the second working state, the first battery module 10, the second battery module 20, and the charging device 100 are connected in series to form a second charging loop;

a battery management unit 40, wherein the battery management unit 40 is connected to the switch unit 30 and the first battery module 10, and the battery management unit 40 is configured to control the switch unit 30 to be in the first working state when a state parameter of the first battery module 10 is less than a preset threshold; and control the switch unit 30 to be in the second working state when the state parameter of the first battery module 10 is greater than or equal to the preset threshold, wherein a charging rate of the first charging loop is higher than a charging rate of the second charging loop.

On this basis, because the charging rate of the first charging loop is higher than the charging rate of the second charging loop, in a charging process of the battery, the battery module forming a charging loop with the charging device 100 is charged by using a different charging rate according to a comparison result of the state parameter of the first battery module 10 and the preset threshold. That is, when the state parameter of the first battery module 10 is less than the preset threshold, the first charging loop is charged by using the charging rate of the first charging loop; and when the state parameter of the first battery module 10 rises to be greater than or equal to the preset threshold, it is changed to charge the first battery module 10 and the second battery module at the same time by using the charging rate of the second charging loop. In this way, compared with the current charging process in which charging is performed by using a smaller charging rate that two battery modules can bear, the charging speed can be improved on the premise of ensuring the charging safety.

It should be noted that the battery apparatus may be any assembly capable of being used for providing electric energy for a power device, and the power device may include an electric vehicle, an electric aircraft, or the like.

In the embodiments of the present application, the battery apparatus includes the first battery module 10 and the second battery module 20, and the first battery module 10 and the second battery module 20 can independently provide electric energy for the power device. Of course, the first battery module 10 and the second battery module 20 can also cooperate to provide electric energy for the power device.

The first battery module 10 and the second battery module 20 are battery modules that are made of different materials, and can bear different maximum charging rates. In order to realize that the charging rate of the first charging loop is greater than the charging rate of the second charging loop, different battery materials may be used so that the maximum charging rate of the first battery module 10 is greater than the maximum charging rate of the second battery module 20.

In addition, the energy density of the first battery module 10 may be set to be lower than the energy density of the second battery module 20, so as to ensure that the power of the battery increases significantly after charging for a long time. Of course, a rated capacity of the first battery module 10 may further be set to be greater than a rated capacity of the second battery module 20, so as to improve the range of the first charging loop during fast charging.

It should be noted that the first battery module 10 and the second battery module 20 may each be an integral battery; or, the first battery module 10 may include M first battery cells, the second battery module 20 may include N second battery cells, and the M and the N are integers greater than 1. The M first battery cells may be in series connection, parallel connection, or parallel-series connection to form the first battery module 10. Similarly, the N second battery cells may be in series connection, parallel connection, or parallel-series connection to form the second battery module 20.

For example, the first battery module 10 includes six first battery cells connected in series, and the second battery module 20 includes six second battery cells connected in series, and so on.

Specifically, the first battery cell may be a battery cell made of a positive electrode material with good thermal stability, including lithium iron phosphate, lithium manganate, and sodium-ion battery, so as to ensure that the charging safety when the first battery module 10 is charged by using a larger charging rate. The second battery cell may be a battery cell composed of a ternary battery group including elements such as nickel (Ni), cobalt (Co), and manganese (Mn).

Further, the energy density of the first battery cell may be greater than or equal to 150 Wh/Kg, and in some embodiments, the energy density of the first battery cell may be greater than or equal to 170 Wh/Kg. The energy density of the second battery cell may be greater than or equal to 230 Wh/Kg, and in some embodiments, the energy density of the second battery cell may be greater than or equal to 250 Wh/Kg. The energy density of the first battery cell is greater than the energy density of the second battery cell.

Further, a ratio between the rated capacity of the first battery cell and the rated capacity of the second battery cell may be set to be greater than or equal to 1 and less than or equal to 5, and in some embodiments, the ratio may be set to be greater than or equal to 1.3 and less than or equal to 2.5.

Of course, when the first battery module 10 includes M first battery cells and the second battery module 20 includes N second battery cells, arrangement locations and arranging methods of the M first battery cells and the N second battery cells may be set according to actual needs. For example, the M first battery cells may be arranged side by side to form a battery pack, the N second battery cells may also be arranged side by side to form a battery pack, and the formed two battery packs may be arranged side by side.

Alternatively, in some embodiments, the first battery module 10 includes M first battery cells, and the second battery module 20 includes N second battery cells. When the M is less than or equal to the N, at least one second battery cell of the N second battery cells is arranged between two adjacent first battery cells of the M first battery cells. When the M is greater than the N, at least one first battery cell of the M first battery cells is arranged between two adjacent second battery cells of the N second battery cells.

On this basis, by arranging the M first battery cells and the N second battery cells in a spacing manner, not only the heat dissipation performance of the first battery module 10 in the charging process may be improved, but also the temperature of the second battery cell may be increased through the heat of the first battery cell parameter, thereby improving the charging performance of the second battery module 20.

It should be noted that the charging rate may be a ratio of a preset current value to the rated capacity of the battery module, and the unit charging rate may be represented by C. The preset current value may be any current value preset in the battery apparatus according to actual needs. The battery apparatus includes the first battery module 10 and the second battery module 20, and therefore, in order to achieve a unified description of the charging rate in the charging process of the battery apparatus, the charging rate may be defined as a ratio of the preset current value to the rated capacity of the first battery module 10 or the rated capacity of the second battery module 20.

Specifically, the charging rate is a ratio of the preset current value to the rated capacity of the first battery module 10. For example, when the preset current value is 100 A, if the rated capacity of the first battery module 10 is 100 Ah, then the unit charging rate C=100 A/100 Ah, and so on.

In the embodiment of the present application, the battery apparatus further includes the switch unit 30, and the switch unit 30 is connected to the first battery module 10 and the second battery module 20.

The switch unit 30 may be any switch assembly that is capable of working in the first working state or the second working state. When the switch unit 30 is in the first working state, the first battery module 10 and the charging device 100 (such as a charging pile) form the first charging loop. When the switch unit 30 is in the second working state, the first battery module 10, the second battery module 20, and the charging device 100 form the second charging loop.

It should be noted that in order to realize that the switch unit 30 may switch between the first working state and the second working state, the switch unit 30 may be a multi-pole multi-throw switch. Alternatively, the switch unit 30 may also be composed of a plurality of single-pole single-throw switches or single-pole multiple-throw switches.

Figure 2:
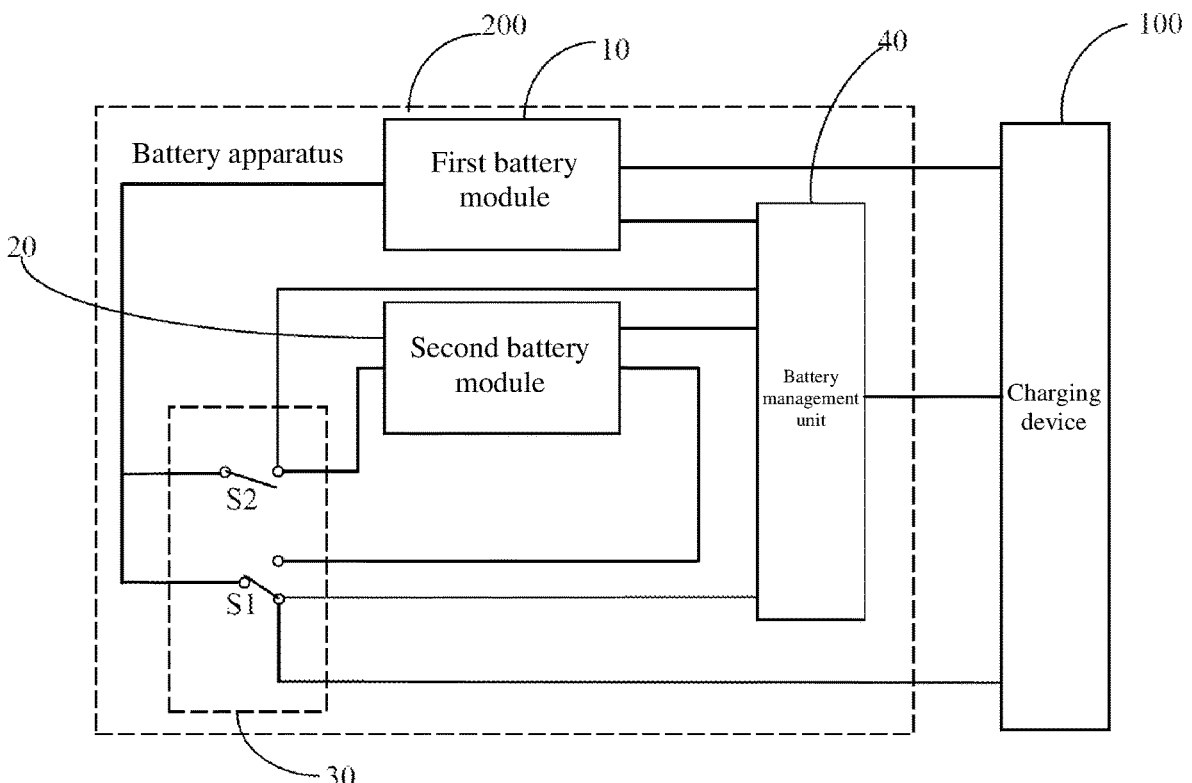
FIG. 2 is a second schematic structural diagram of a charging system according to an embodiment of the present application.
Figure 3:
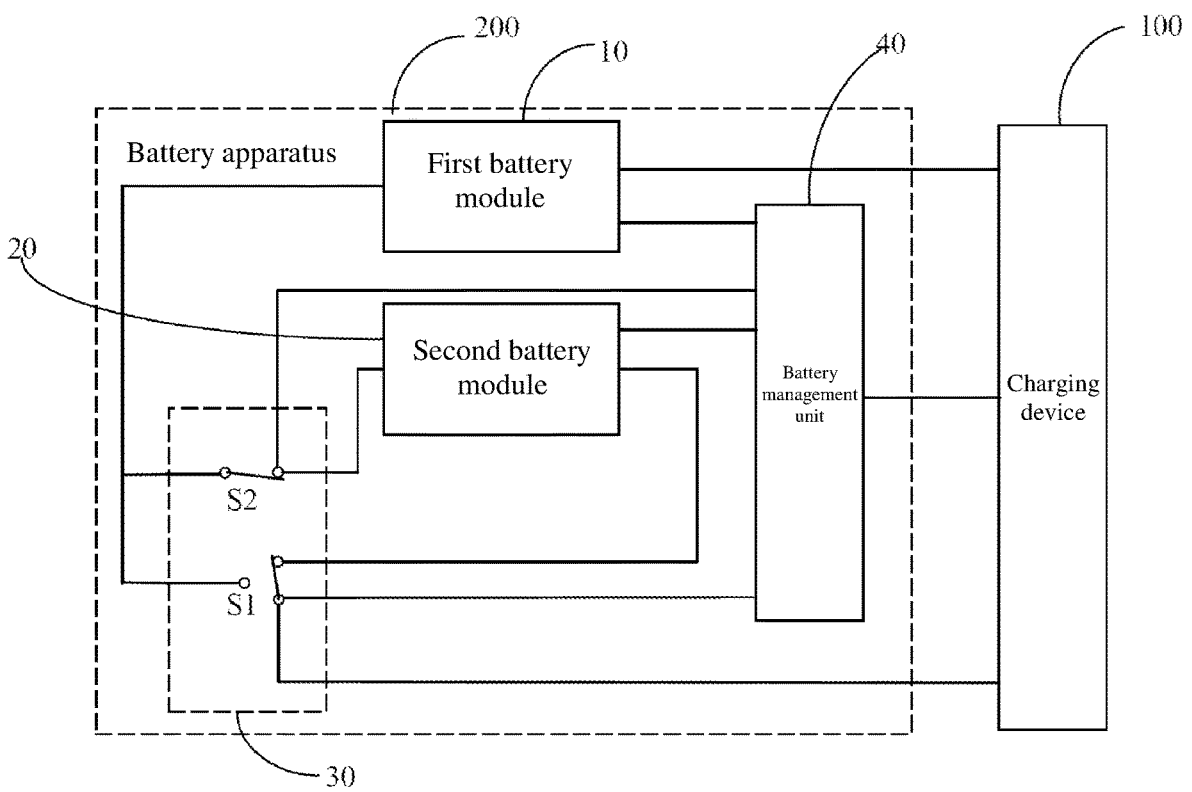
FIG. 3 is a third schematic structural diagram of a charging system according to an embodiment of the present application.

In some embodiments, as shown in FIG. 2 and FIG. 3, a first end of the first battery module 10 is configured to be connected to a second end of the charging device 100 when the charging device 100 charges the battery apparatus.

The switching unit 30 includes:

a first switch S1, wherein a first end of the first switch S1 is connected to the battery management unit 40, and the first end of the first switch S1 is further configured to be connected to a first end of the charging device 100 when the charging device 100 charges the battery apparatus; a second end of the first switch S1 is connected to a second end of the first battery module 10; and a third end of the first switch S1 is connected to a first end of the second battery module 20; and a second switch S2, wherein a first end of the second switch S2 is connected to the second end of the first switch S1, and a second end of the second switch S2 is connected to a second end of the second battery module 20;

wherein when the charging device 100 charges the battery apparatus, if the first end of the first switch S1 is connected to the second end of the first switch S1, and the first end of the second switch S2 is disconnected from the second end of the second switch S2, the first battery module 10 and the charging device 100 form the first charging loop, as shown in FIG. 2; and if the first end of the first switch S1 is connected to the third end of the first switch S1, and the first end of the second switch S2 is connected to the second end of the second switch S2, then the first battery module 10, the second battery module 20, and the charging device 100 are connected in series to form the second charging loop, as shown in FIG. 3.

On this basis, by arranging the first switch S1 and the second switch S2, it may be achieved that formation of the first charging loop and the second charging loop between the battery apparatus and the charging device 100 is controlled respectively. The implementation method is simple and the operation reliability is high.

It should be noted that the "connection" described in the embodiments of the present application may be understood as a physical connection relationship; of course, it may also be an electrical connection relationship, which is not limited here.

In the embodiments of the present application, the battery apparatus further includes a battery management unit 40, and the battery management unit 40 is connected to the switch unit and the first battery module 10.

The battery management unit 40 may be any control assembly capable of controlling switching of the working state of the switch unit 30, and when the state parameter of the first battery module 10 is less than a preset threshold, the battery management unit 40 may control the first switch S1 to be in the first working state, so that the first battery module 10 and the charging device 100 form the first charging loop. When the state parameter of the first battery module 10 is greater than or equal to the preset threshold, the first switch S1 may be controlled to be in the second working state, so that the first battery module 10, the second battery module 20, and the charging device 100 form the second charging loop.

In addition, the battery management unit 40 may acquire the state parameter of the first battery module 10 in a charging process, compare the state parameter of the first battery module 10 with the preset threshold, and determine whether the state parameter of the first battery module 10 is less than the preset threshold.

Of course, the battery management unit 40 may also be configured to manage the charging process and discharging process of the first battery module 10 and the second battery module 20. Specifically, the battery management unit 40 may further be connected to the second battery module 20 to obtain the state parameters of the first battery module 10 and the second battery module 20 in the charging and discharging processes.

It should be noted that the state parameter of the first battery module 10 may include a State of Charge (SOC) or a voltage.

According to some embodiments of the present application, FIG. 4 is a schematic flow chart of a control method of a battery apparatus according to an embodiment of the present application, and the control method of a battery apparatus may be applied to the battery apparatus. As shown in FIG. 4, the control method of a battery apparatus may include the following steps S401 to S403.

S401: Acquire a state parameter of a first battery module in the battery apparatus;

S402: Control the first battery module and the charging device to form a first charging loop when the state parameter of the first battery module is less than a preset threshold; and S403: Control the first battery module, a second battery module in the battery apparatus and the charging device to be connected in series to form a second charging loop when the state parameter of the first battery module is greater than or equal to the preset threshold.

A charging rate of the first charging loop is higher than a charging rate of the second charging loop.

On this basis, because the charging rate of the first charging loop is higher than the charging rate of the second charging loop, in a charging process of the battery, the battery module forming a charging loop with the charging device is charged by using a different charging rate according to a comparison result of the state parameter of the first battery module and the preset threshold. That is, when the state parameter of the first battery module is less than the preset threshold, the first charging loop is charged by using the charging rate of the first charging loop; and when the state parameter of the first battery module rises to be greater than or equal to the preset threshold, it is changed to charge the first battery module and the second battery module at the same time by using the charging rate of the second charging loop. In this way, compared with the current charging process in which charging is performed by using a smaller charging rate that two battery modules can bear, the charging speed can be improved on the premise of ensuring the charging safety.

In the step 401, in the charging process of the battery apparatus, the battery management unit in the battery apparatus may acquire the state parameter of the first battery module thereof.

The acquiring the state parameter of the first battery module may be detecting the state parameter of the first battery module when the battery management unit of the battery apparatus detects that the battery apparatus is connected to the charging device.

It should be noted that, the state parameter of the first battery module may be any parameter capable of reflecting the electric quantity of the first battery module. Specifically, the state parameter of the first battery module may include an SOC or a voltage, so that the method of acquiring the state parameter of the first battery module is simple and flexible.

In the embodiment of the present application, after the battery apparatus acquires the state parameter of its first battery module, the battery management unit of the battery apparatus compares the acquired state parameter of the first battery module with the preset threshold to determine whether the state parameter of the first battery module is less than the preset threshold.

The preset threshold may be a value set according to actual needs, and the preset threshold is greater than zero and less than or equal to the state parameter when a charged battery capacity of the first battery module is a rated capacity.

For example, when the state parameter is a voltage, the preset threshold is a preset voltage, and the preset voltage is greater than zero, and less than or equal to a voltage of the first battery module in a fully charged state (that is, the charged battery capacity is the rated capacity), and so on.

In addition, the preset threshold may also be set according to the rated capacity of the first battery module and the rated capacity of the second battery module.

Specifically, when a rated capacity of the first battery module is higher than a rated capacity of the second battery module, if an uncharged battery capacity of the first battery module is equal to the rated capacity of the second battery module, then the state parameter of the first battery module is equal to the preset threshold.

On this basis, when the uncharged battery capacity of the first battery module is equal to the rated capacity of the second battery module, the first battery module and the second battery module may be charged by switching to a smaller charging rate, which can not only improve the charging speed, but also ensure the charging safety.

Exemplarily, as shown in FIG. 5, assuming that the rated capacity of the first battery module is 100 Ah, and the rated capacity of the second battery module is 50 Ah, when the first battery module is charged to 50% of the rated capacity, that is, an uncharged battery capacity of the first battery module is 50 Ah, a charging voltage of the first battery module is V0, and the V0 is set as the preset threshold.

Of course, when the rated capacity of the first battery module is higher than the rated capacity of the second battery module, it may also be set that the state parameter of the first battery module is equal to the preset threshold when the uncharged battery capacity of the first battery module is not equal to the rated capacity of the second battery module. For example, when the uncharged battery capacity of the first battery module is 80% of the rated capacity of the second battery module, the charging voltage of the first battery module is the preset threshold, and so on, which is not limited here.

In the step 402, when the charging device determines that the state parameter of the first battery module is less than the preset threshold, the battery management unit may control the first battery module and the charging device to form the first charging loop, so that the charging device may charge the first battery module by using the charging rate of the first charging loop.

The charging rate of the first charging loop may be the maximum charging rate that the first battery module may bear; Alternatively, it may be greater than the maximum charging rate that the second battery module may bear, and less than the maximum charging rate that the first battery module may bear.

Exemplarily, as shown in FIG. 5, when the state parameter is a voltage and the preset threshold is V0, if the charging voltage of the first battery module is less than the V0, that is, the first battery module is not charged to 50% of the rated capacity, then the battery management unit controls the switch unit to be in the first working state, so that the charging device and the first battery module form a charging loop, and the charging device charges the first battery module by using the maximum charging rate that the first battery module can bear.

In addition, after the first battery module and the charging device form the first charging loop, the charging device may charge the first battery module by using a fixed charging rate.

In some embodiments, after the step S402, the method may further include:

acquiring a charged battery capacity of the first battery module; and updating the charging rate of the first charging loop based on the charged battery capacity of the first battery module.

On this basis, during the process of the charging device charging the first battery module through the first charging loop, the first battery module can be charged using a charging rate determined based on the charged battery capacity of the first battery module, so that the charging rate can be adjusted according to the charging amount.

The updating the charging rate of the first charging loop based on the charged battery capacity of the first battery module may be that a corresponding relationship between the charged battery capacity and the charging rate is preset in the battery apparatus, and the battery apparatus may determine, according to the preset corresponding relationship, a charging rate having a corresponding relationship with the charged battery capacity of the first battery module to serve as the charging rate of the first charging loop.

In addition, there may be a linear relationship between the charged battery capacity of the first battery module and the charging rate of the first charging loop.

Specifically, a first charging rate determined based on a first charged battery capacity of the first battery module is higher than a second charging rate determined based on a second charged battery capacity of the first battery module, and the first charged battery capacity is lower than the second charged battery capacity.

On this basis, the charging rate of the first charging loop may be reduced as the charged battery capacity of the first battery module increases, thereby not only ensuring the charging speed, but also improving the security in the charging process.

Exemplarily, assuming that the rated capacity of the first battery module is 100 Ah, the rated capacity of the second battery module is 50 Ah, and the preset current value is 100 A, that is, the unit charging rate 1 C=100 A/100 Ah. Then, when the first battery module and the charging device form the first charging loop, the first charging rate of 1.5 C (that is, a charging current is 150 A) may be used for charging the first battery module to 30% of the rated capacity, that is, the charged battery capacity is 30 Ah (that is, the first charged battery capacity). Then, the second charging rate of 1 C (that is, a charging current is 100 A) is used for charging from 30% of the rated capacity to 50% of the rated capacity, that is, charging the charged battery capacity from 30 Ah to 50 Ah (that is, the second charged battery capacity).

In the step 403, when the charging device determines that the state parameter of the first battery module is less than the preset threshold, the battery management unit may control the first battery module, the second battery module, and the charging device to form the first charging loop, so that the charging device may charge the first battery module and the second battery module by using the charging rate of the second charging loop.

The charging rate of the second charging loop is less than the charging rate of the first charging loop, that is, in the charging process, when the state parameter of the first battery module rises to the preset threshold due to charging, the charging device may reduce the charging rate output to the battery apparatus from the charging rate of the first charging loop to the charging rate of the second charging loop.

It should be noted that the charging rate of the second charging loop may be the maximum charging rate that the second battery module can bear, or may be less than the maximum charging rate that the second battery module can bear, which is not limited here.

Exemplarily, as shown in FIG. 5, assuming that the rated capacity of the first battery module is 100 Ah, the rated capacity of the second battery module is 50 Ah, and the preset current value is 100 A, that is, the unit charging rate 1 C=100 A/100 Ah. Then, when the first battery module, the second battery module, and the charging device form the second charging loop, the second battery module can only bear a charging rate of 0.5 C (that is, the charging current is 50 A). At this time, the charging current charges the first battery module and the second battery module by using the charging rate of 0.5 C at the same time.

In addition, the charging device charging the first battery module by using the charging rate of the first charging loop may be that the battery management unit sends a charging request indicating the charging rate of the first charging loop to the charging device when the first charging loop is formed. The charging device responds to the charging request and charges the first battery module by using the charging rate of the first charging loop. Similarly, the charging device charges the first battery module and the second battery module by using the charging rate of the second charging loop is a similar process, which will not be repeated here.

Of course, after the charging device charges the first battery module and the second battery module by using the charging rate of the second charging loop, if the battery management unit detects that the state parameter of the first battery module or the state parameter of the second battery module reaches a maximum preset threshold, at this time, the battery management unit may send a charging stopping request to the charging device so that the charging device stops charging the first battery module and the second battery module.

The battery apparatus according to the embodiment of the present application is described in detail below with reference to the drawings.

FIG. 6 is a schematic structural view of a battery apparatus according to an embodiment of the present application. As shown in FIG. 6, the battery apparatus 600 includes a state parameter acquisition module 601 and a control module 602.

The state parameter acquisition module 601 is configured to acquire a state parameter of a first battery module in the battery apparatus.

The control module 602 is configured to:

control the first battery module and the charging device to form a first charging loop when the state parameter of the first battery module is less than a preset threshold; and control the first battery module, a second battery module in the battery apparatus and the charging device to be connected in series to form a second charging loop when the state parameter of the first battery module is greater than or equal to the preset threshold.

A charging rate of the first charging loop is higher than a charging rate of the second charging loop.

In this embodiment, because the charging rate of the first charging loop is higher than the charging rate of the second charging loop, in a charging process of the battery, the battery module forming a charging loop with the charging device is charged by using a different charging rate according to a comparison result of the state parameter of the first battery module and the preset threshold. That is, when the state parameter of the first battery module is less than the preset threshold, the first charging loop is charged by using the charging rate of the first charging loop; and when the state parameter of the first battery module rises to be greater than or equal to the preset threshold, it is changed to charge the first battery module and the second battery module at the same time by using the charging rate of the second charging loop. In this way, compared with the current charging process in which charging is performed by using a smaller charging rate that two battery modules can bear, the charging speed can be improved on the premise of ensuring the charging safety.

In some embodiments, the apparatus 600 may further include a charged battery capacity acquisition module and a charging rate updating module.

The charged battery capacity acquisition module is configured to acquire a charged battery capacity of the first battery module.

The charging rate updating module is configured to update the charging rate of the first charging loop based on the charged battery capacity of the first battery module.

In this embodiment, in the process of the charging device charging the first battery module through the first charging loop, the first battery module may be charged by using the charging rate determined based on the charged battery capacity of the first battery module, so that the charging rate may be adjusted according to a charging capacity.

In some embodiments, a first charging rate determined based on a first charged battery capacity of the first battery module is higher than a second charging rate determined based on a second charged battery capacity of the first battery module, and the first charged battery capacity is lower than the second charged battery capacity.

In this embodiment, the charging rate of the first charging loop may be reduced as the charged battery capacity of the first battery module increases, thereby not only ensuring the charging speed, but also improving the security in the charging process.

In some embodiments, the state parameter may include the state of charge SOC or a voltage.

In this embodiment, the method of acquiring the state parameter of the first battery module may be simple and flexible.

In some embodiments, when a rated capacity of the first battery module is higher than a rated capacity of the second battery module, if an uncharged battery capacity of the first battery module is equal to the rated capacity of the second battery module, then the state parameter of the first battery module is equal to the preset threshold.

In this embodiment, when the uncharged battery capacity of the first battery module is equal to the rated capacity of the second battery module, the first battery module and the second battery module may be charged by switching to a smaller charging rate, which can not only improve the charging speed, but also ensure the charging safety.

Other details of the battery apparatus according to the embodiment of the present application are similar to the control method of the battery apparatus described above with reference to the example shown in FIG. 3, and can achieve corresponding technical effects. For the sake of brevity, details are not repeated here.

Figure 7:
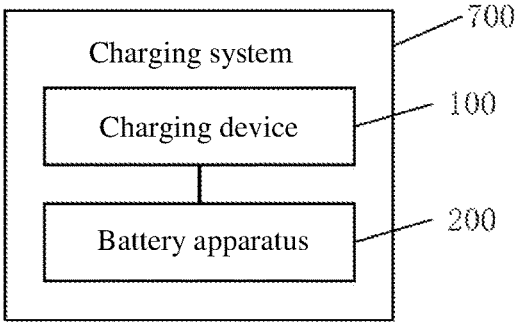
FIG. 7 is a fourth schematic structural diagram of a charging system according to an embodiment of the present application.

FIG. 7 is a system architectural diagram of a battery system according to an embodiment of the present application. As shown in FIG. 7, the battery control system includes the charging device 100 and a battery apparatus 200.

The charging device 100 is similar to the charging device 100 shown in the embodiments of the present application with reference to any accompanying drawing in FIG. 1 to FIG. 4, and its specific content may be obtained with reference to the relevant description of the charging device 100 in the part of the embodiments of the present application, which will not be repeated here.

The battery apparatus 200 is similar to the battery apparatus 200 shown in the embodiments of the present application with reference to FIG. 1 to FIG. 4, and its specific content may be obtained with reference to the relevant description of the battery apparatus 200 in the part of the embodiments of the present application, which will not be repeated here.

Figure 8:
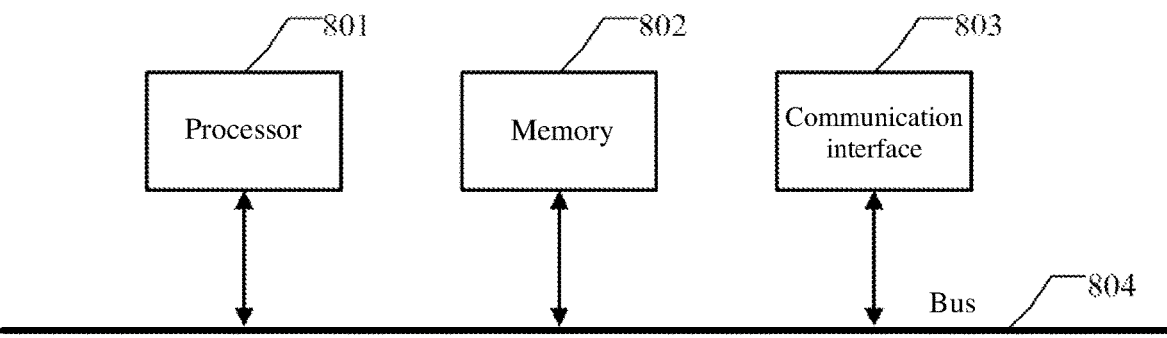
FIG. 8 is a schematic diagram of a hardware structure of a battery apparatus according to an embodiment of the present application.

FIG. 8 shows a schematic diagram of a hardware structure of a battery apparatus according to an embodiment of the present application.

The battery apparatus may include a processor 801 and a memory 802 storing computer program instructions.

Specifically, the processor 801 may include a Central Processing Unit (CPU), or an Application Specific Integrated Circuit (ASIC), or one or more integrated circuits that may be configured to implement embodiments of the present application.

The memory 802 may include a mass memory for data or instructions. For example and non-restrictively, the memory 802 may include a Hard Disk Drive (HDD), a floppy disk drive, a flash memory, an optical disk, a magneto-optical disk, a magnetic tape, or a Universal Serial Bus (USB) drive, or a combination of two or more of the above. In some examples, the memory 802 may include removable or non-removable (or fixed) media, or the memory 802 may be a non-volatile solid state memory. In some embodiments, the memory 802 may be internal or external to the battery apparatus.

In some examples, the memory 802 may be a Read-Only Memory (ROM). In one example, the ROM may be a mask programmable ROM, a programmable ROM (PROM), an erasable PROM (EPROM), an electrically erasable PROM (EEPROM), an electrically alterable ROM (EAROM), or a flash memory or a combination of one or more of the above.

The memory 802 may include a read-only memory (ROM), a random-access memory (RAM), a disk storage medium device, an optical storage medium device, a flash memory device, or an electrical, optical or other physical/tangible memory device. Therefore, usually, the memory includes one or more tangible (non-transitory) computer readable storage mediums (e.g., memory devices) encoded with software including computer-executable instructions, and the software, when executed (e.g., by one or more processors), is operable to perform the operations described with reference to the method according to an aspect of the present disclosure.

The processor 801 reads and executes the computer program instructions stored in the memory 802 to implement the method in the embodiment shown in FIG. 4, and achieve the corresponding technical effect achieved by performing the method/step in the example shown in FIG. 4, which will not be repeated here for simplicity.

In an example, the battery apparatus may further include a communication interface 803 and a bus 804. As shown in FIG. 8, the processor 801, the memory 802, and the communication interface 803 complete communication with each other through the bus 804.

The communication interface 803 is mainly configured to implement communication between the modules, apparatuses, units, and/or devices in the examples of the present application.

The bus 804 includes hardware, software, or both hardware and software, and couples the components of the online data flow metering device to each other. For example and non-restrictively, the bus may include an Accelerated Graphics Port (AGP) or other graphics buses, an Extended Industry Standard Architecture (EISA) bus, a Front Side Bus (FSB), a Hyper Transport (HT) interconnection, an Industry Standard Architecture (ISA) bus, an infiniband interconnection, a low pin count (LPC) bus, a memory bus, a microchannel architecture (MCA) bus, a peripheral component interconnect (PCI) bus, a PCI-Express (PCI-X) bus, a serial advanced technology attachment (SATA) bus, a Video Electronics Standards Association local (VLB) bus, or other appropriate buses, or a combination of two or more of the above. The bus 804 may include one or more buses, where appropriate. While examples in the present application describe and illustrate a particular bus, the present application contemplates any appropriate bus or interconnect.

The battery apparatus may perform a control method of a battery apparatus in the embodiments of the present application, thereby implementing the battery apparatus and the control method thereof described with reference to FIG. 1 to FIG. 6.

In addition, in combination with the control method of a battery apparatus and the battery apparatus in the above embodiments, the embodiments of the present application may provide a computer storage medium for implementation. The computer-readable storage medium stores computer program instructions. When executed by a processor, the computer program instructions implement any battery and a control method thereof according to the above embodiments.

To be specific, the present application is not limited to the specific configurations and processes described above and shown in the figures. For the sake of brevity, detailed descriptions of known methods are omitted here. In the embodiments, several specific steps are described and shown as examples. However, the method process of the present application is not limited to the specific steps that are described and shown, and those skilled in the art can make various alterations, modifications, and additions, or change the order between the steps after comprehending the spirit of the present application.

The functional blocks shown in the above structural block diagrams may be implemented as hardware, software, firmware, or a combination thereof. When the functional blocks are implemented as hardware, the hardware may be, for example, an electronic circuit, an Application Specific Integrated Circuit (ASIC), appropriate firmware, a plug-in, a function card, or the like. When the functional blocks are implemented as software, elements of the present application are programs or code segments used to execute required tasks. The programs or code segments may be stored in a machine-readable medium or transmitted over a transmission medium or communication link by a data signal carried in a carrier wave. The "machine-readable medium" may include any medium that is capable of storing or transmitting information. Examples of machine-readable mediums include an electronic circuit, a semiconductor memory device, a ROM, a flash memory, an erasable ROM (EROM), a floppy disk, a CD-ROM, an optical disk, a hard disk, an optic fiber medium, a Radio Frequency (RF) link, and the like. The code segments may be downloaded via a computer network such as the Internet or an intranet.

It should further be noted that the exemplary embodiments mentioned in the present application describe some methods or systems based on a series of steps or apparatuses. However, the present application is not limited to the order of the above steps. In other words, the steps may be performed in the order mentioned in the examples or in an order different from the order in the examples, or several steps may be performed concurrently.

Aspects of the present disclosure are described above with reference to flow charts and/or block diagrams of methods, apparatuses, devices, and computer program products according to the embodiments of the present disclosure. It should be understood that each block of the flow charts and/or block diagrams and combinations of blocks in the flow charts and/or block diagrams may be implemented by the computer program instructions. These computer program instructions may be provided to a processor of a general purpose computer, a special purpose computer, or another programmable data processing apparatus to produce a machine such that execution of these instructions via the processor of the computer or another programmable data processing apparatus enables implementation of the functions/actions specified in one or more blocks of the flow charts and/or block diagrams. Such processors may be, but are not limited to, general purpose processors, special purpose processors, application specific processors, or field programmable logic circuits. It is also understandable that each block in the block diagrams and/or flow charts and combinations of blocks in the block diagrams and/or flow charts can also be implemented by dedicated hardware for performing specified functions or actions, or may be implemented by a combination of dedicated hardware and computer instructions.

The above description merely provides specific embodiments of the present application. Those skilled in the art can clearly understand that, for convenience and simplicity of description, corresponding processes in the above method examples may be referred to for specific working process of the above described systems, modules and units. The description will not be repeated here. It should be understood that the scope of protection of the present application is not limited to the specific embodiments. Any person skilled in the technical field may easily conceive of various equivalent modifications or replacements within the technical scope disclosed in the present application. All these modifications or replacements should be encompassed within the scope of protection of the present application.

What is claimed is:

1. A control method of a battery apparatus, comprising:
acquiring a state parameter of a first battery module of the battery apparatus;
controlling the first battery module and a charging device to form a first charging loop to charge the first battery module in response to the state parameter of the first battery module being less than a preset threshold; and
controlling the first battery module, a second battery module of the battery apparatus, and the charging device to be connected in series to form a second charging loop to charge the first battery module and the second battery module in response to the state parameter of the first battery module being greater than or equal to the preset threshold;
wherein:
a charging rate of the first charging loop is higher than a charging rate of the second charging loop; and
the state parameter comprises a state of charge (SOC) or a voltage.

2. The control method according to claim 1, further comprising:
acquiring a charged battery capacity of the first battery module; and
updating the charging rate of the first charging loop based on the charged battery capacity of the first battery module.

3. The control method according to claim 2, wherein a first charging rate determined based on a first charged battery capacity of the first battery module is higher than a second charging rate determined based on a second charged battery capacity of the first battery module, and the first charged battery capacity is lower than the second charged battery capacity.

4. The control method according to claim 1, wherein in a scenario where a rated capacity of the first battery module is higher than a rated capacity of the second battery module, the state parameter of the first battery module is equal to the preset threshold if an uncharged battery capacity of the first battery module is equal to the rated capacity of the second battery module.

5. A computer storage medium, wherein the computer storage medium stores computer program instructions that, when executed by a processor, cause the processor to implement the control method according to claim 1.

6. A battery apparatus, comprising:
a first battery module and a second battery module;
a state parameter acquisition module configured to acquire a state parameter of the first battery module of the battery apparatus;

a control module configured to:

control the first battery module and a charging device to form a first charging loop to charge the first battery module in response to the state parameter of the first battery module being less than a preset threshold; and control the first battery module, the second battery module of the battery apparatus, and the charging device to be connected in series to form a second charging loop to charge the first battery module and the second battery module in response to the state parameter of the first battery module being greater than or equal to the preset threshold;

wherein:

a charging rate of the first charging loop is higher than a charging rate of the second charging loop; and the state parameter comprises a state of charge (SOC) or a voltage.

7. The battery apparatus according to claim 6, further comprising:

a charged battery capacity acquisition module configured to acquire a charged battery capacity of the first battery module; and a charging rate updating module configured to update the charging rate of the first charging loop based on the charged battery capacity of the first battery module.

8. The battery apparatus according to claim 7, wherein a first charging rate determined based on a first charged battery capacity of the first battery module is higher than a second charging rate determined based on a second charged battery capacity of the first battery module, and the first charged battery capacity is lower than the second charged battery capacity.

9. The battery apparatus according to claim 6, wherein in a scenario where a rated capacity of the first battery module is higher than a rated capacity of the second battery module, the state parameter of the first battery module is equal to the preset threshold if an uncharged battery capacity of the first battery module is equal to the rated capacity of the second battery module.

10. The battery apparatus according to claim 6, further comprising:

a switch unit, wherein the switch unit is connected to the first battery module and the second battery module, the switch unit is in a first working state or a second working state, when a charging device charges the battery and the switch unit is in the first working state, the first battery module and the charging device form a first charging loop, and when the charging device charges the battery and the switch unit is in the second working state, the first battery module, the second battery module, and the charging device are connected in series to form a second charging loop;

a battery management unit, wherein the battery management unit is connected to the switch unit and the first battery module, and the battery management unit is configured to:

control the switch unit to be in the first working state in response to a state parameter of the first battery module being less than a preset threshold; and control the switch unit to be in the second working state in response to the state parameter of the first battery module being greater than or equal to the preset threshold.

11. The battery apparatus according to claim 10, wherein:

a first end of the first battery module is configured to be connected to a second end of the charging device when the charging device charges the battery apparatus;

the switch unit comprises:

a first switch, wherein:

a first end of the first switch is connected to the battery management unit and configured to be connected to a first end of the charging device when the charging device charges the battery apparatus;

a second end of the first switch is connected to a second end of the first battery module; and a third end of the first switch is connected to a first end of the second battery module; and a second switch, wherein a first end of the second switch is connected to the second end of the first switch, and a second end of the second switch is connected to a second end of the second battery module;

wherein when the charging device charges the battery apparatus:

the first battery module and the charging device form the first charging loop in response to the first end of the first switch being connected to the second end of the first switch, and the first end of the second switch being disconnected from the second end of the second switch; and the first battery module, the second battery module, and the charging device are connected in series to form the second charging loop in response to the first end of the first switch being connected to a third end of the first switch, and the first end of the second switch being connected to the second end of the second switch.

12. The battery apparatus according to claim 6, wherein:

the first battery module comprises M first battery cells, the second battery module comprises N second battery cells, and M and N are both integers greater than 1;

in a scenario where M is less than or equal to N, at least one second battery cell of the N second battery cells is arranged between two adjacent first battery cells of the M first battery cells; and in a scenario where M is greater than N, at least one first battery cell of the M first battery cells is arranged between two adjacent second battery cells of the N second battery cells.

13. A control method of a battery apparatus, comprising:

acquiring a state parameter of a first battery module of the battery apparatus;

controlling the first battery module and a charging device to form a first charging loop in response to the state parameter of the first battery module being less than a preset threshold;

acquiring a charged battery capacity of the first battery module; and updating the charging rate of the first charging loop based on the charged battery capacity of the first battery module; and controlling the first battery module, a second battery module of the battery apparatus, and the charging device to be connected in series to form a second charging loop in response to the state parameter of the first battery module being greater than or equal to the preset threshold;

wherein:

a charging rate of the first charging loop is higher than a charging rate of the second charging loop;

a first charging rate determined based on a first charged battery capacity of the first battery module is higher than a second charging rate determined based on a second charged battery capacity of the first battery module, and the first charged battery capacity is lower than the second charged battery capacity; and the state parameter comprises a state of charge (SOC) or a voltage.

* * * * *